(12) United States Patent
Duan et al.

(10) Patent No.: US 11,418,738 B2
(45) Date of Patent: Aug. 16, 2022

(54) IMAGE SENSOR FOR REAL TIME CALIBRATION OF DARK CURRENT AND CALIBRATION METHOD

(71) Applicants: SHANGHAI IC R&D CENTER CO., LTD., Shanghai (CN); CHENGDU IMAGE DESIGN TECHNOLOGY CO. LTD., Chengdu (CN)

(72) Inventors: Jiebin Duan, Shanghai (CN); Chen Li, Shanghai (CN); Pengfei Wang, Shanghai (CN); Tao Zhou, Shanghai (CN)

(73) Assignees: SHANGHAI IC R&D CENTER CO., LTD, Shanghai (CN); CHENGDU IMAGE DESIGN TECHNOLOGY CO., LTD., Chengdu (CN)

( * ) Notice: Subject to any disclaimer, the term of this patent is extended or adjusted under 35 U.S.C. 154(b) by 29 days.

(21) Appl. No.: 17/043,755

(22) PCT Filed: Aug. 29, 2018

(86) PCT No.: PCT/CN2018/102890
§ 371 (c)(1),
(2) Date: Sep. 30, 2020

(87) PCT Pub. No.: WO2019/218528
PCT Pub. Date: Nov. 21, 2019

(65) Prior Publication Data
US 2021/0058574 A1    Feb. 25, 2021

(30) Foreign Application Priority Data

May 16, 2018 (CN) .......................... 201810486626.6

(51) Int. Cl.
*H04N 5/361*    (2011.01)
*H04N 9/04*    (2006.01)
*H01L 27/146*    (2006.01)

(52) U.S. Cl.
CPC .......... *H04N 5/361* (2013.01); *H01L 27/1463* (2013.01); *H01L 27/14621* (2013.01);
(Continued)

(58) Field of Classification Search
CPC ...... H04N 5/361; H04N 9/0455; H04N 5/369; H01L 27/14621; H01L 27/14623;
(Continued)

(56) References Cited

U.S. PATENT DOCUMENTS 10,104,321 B1 * 10/2018 Sohn ................... H04N 5/3765
2009/0134433 A1 * 5/2009 Jung ...................... H04N 5/361
257/E31.127

(Continued)

FOREIGN PATENT DOCUMENTS

CN         105206631 A1    12/2015

*Primary Examiner* — Gevell V Selby
(74) *Attorney, Agent, or Firm* — Tianchen LLC.; Yuan R. Li; Yi Fan Yin

(57) ABSTRACT

The present invention discloses an image sensor for real-time calibration of dark current, including a pixel array comprises at least a pixel unit, the pixel unit includes a pixel photosensitive portion, a pixel dark shielding portion and a subtraction circuit, photodiodes in the pixel photosensitive portion and the pixel dark shielding portion are isolated by deep trench isolations, the pixel dark shielding portion are covered by a dark shielding layer; both of the pixel photosensitive portion and the pixel dark shielding portion adopt a same voltage and sequential control, a light ambient voltage signal and a non-light ambient voltage signal are generated and connected to both ends of a subtraction circuit to realize subtraction and dark current calibration. The (Continued)

present invention discloses an image sensor for real-time calibration of dark current, which can make the dark current calibration completed directly within the pixel, and can better cover the dark pixel part, so as to make calibration value of dark current and dark noise more accurate.

10 Claims, 5 Drawing Sheets

(52) U.S. Cl.
CPC .. *H01L 27/14623* (2013.01); *H01L 27/14645* (2013.01); *H04N 9/0455* (2018.08)

(58) Field of Classification Search
CPC ........... H01L 27/1463; H01L 27/14645; H01L 27/14612; H01L 27/14627
See application file for complete search history.

(56) References Cited

U.S. PATENT DOCUMENTS

| | | | |
|---|---|---|---|
| 2014/0353471 | A1 | 12/2014 | Raynor et al. |
| 2017/0271384 | A1* | 9/2017 | Zheng ............... H01L 27/14623 |
| 2017/0347042 | A1* | 11/2017 | Borthakur .......... H04N 5/35563 |
| 2018/0176491 | A1* | 6/2018 | Murao ................... H04N 5/374 |
| 2018/0308883 | A1* | 10/2018 | Yanagita ........... H01L 27/14621 |

* cited by examiner

IMAGE SENSOR FOR REAL TIME CALIBRATION OF DARK CURRENT AND CALIBRATION METHOD

CROSS-REFERENCE TO RELATED APPLICATION

This application claims priority of International Patent Application Serial No. PCT/CN2018/102890, filed Aug. 29, 2018, which is related to and claims priority of Chinese patent application Serial No. 201810486626.6, filed May 16, 2018. The entirety of each of the above-mentioned patent applications is hereby incorporated herein by reference and made a part of this specification.

TECHNICAL FIELD

The disclosure relates to the technical field of integrated circuits, and particularly to an image sensor for real-time calibration of dark current and a calibration method.

BACKGROUND

An image sensor is a detector that senses light intensity and outputs an intensity map. Therefore, it is a key indicator of the image sensor to accurately output a signal for expressing absolute intensity of light at each pixel. In a pixel array of the image sensor, generally several lines of dark pixel arrays are added to upper and lower sides of an entire sensor chip, that is, some opaque materials are used to shade part of the pixel array and prevent from receiving light, so as to calibrate absolute value of light signal which detected by a photosensitive part of the pixel array, as shown in FIG. 1. In general, outputs of photosensitive pixels include not only a photo-generated signal, but also a dark signal and dark noise caused by various electric leakages, both of them are output in form of superposition. But part that can actually reflect the light intensity is only part of the photo-generated signal. Therefore, an image sensor array is usually composed of an entire photosensitive pixel array and an array of several rows or several columns of dark pixels distributed around the chip, and dark current and dark noise are calibrated through the dark pixel rows or columns.

However, when a chip is working, temperature distribution of each region on the chip is not uniform, so when dark current of the chip is a variable with temperature, it is obviously not accurate that the dark current calibration is performed only by a few rows of dark pixels in edge region of the chip, distribution of dark current in range of an image sensor chip is non-uniform, firstly working temperature at different position on the entire chip is different, and the dark current is proportional to temperature. An analog circuit in the image sensor is a biggest heat source on the chip, in current products, analog circuit modules are generally evenly distributed on upper and lower edges of the chip. Therefore, temperature change on the entire chip is a change from the upper and lower edges of the chip to center point in turns, from high to low, as shown in FIG. 0.2, based on this, assuming uniform process parameter distribution, the dark current is also a transition from chip edge to center position, and changes from high to low. Therefore, conventionally using several rows or several columns of shaded dark pixel arrays placed at fixed positions on the chip edge or at edge of the pixel array to calibrate the dark current of the entire photosensitive pixel array presents a challenge in accuracy. Because there may be a large gap between dark current of the dark pixel array and the dark current on the photosensitive pixel array. At the same time, even on a photosensitive pixel array, the dark current of each pixel point is greatly deviated due to temperature fluctuations. At the same time, generation of the dark current or a leakage current is also determined by uniformity of the process, that is, various process defects and device deviations per square micrometer are likely to have certain numerical fluctuations, and it is also quite difficult to require a certain process uniformity on the entire pixel array, therefore, calibration based on several rows of dark pixels faces challenge of technological process uniformity. The image sensors also mostly use a method of line-by-line readout, during an entire readout process, each pixel experiences a different readout environment, therefore, a conventionally signal calibration using several rows or several columns of dark pixels in fixed positions lacks real-time performance. Moreover, a method using dark pixel array on chip edge needs to read out all signals of an entire pixel array, and then carry out signal calibration, which is neither convenient nor real-time and thus introduces calibration error. Finally, the dark pixel array at the chip edge also needs to be covered with a metal or other dark shielding layers to avoid receiving light, due to limitation of metal interconnection within the pixels and connection mode of external control signal lines, generally a dark shielding layer above a third layer metal is used, which means that there is a certain height difference between the dark shielding layer and a photodiode, and leads to a part of the light leak out, as a result, dark current potential of dark pixels is higher than output in real dark environment.

SUMMARY

A technical problem to be solved in the present invention is to provide an image sensor for real-time calibration of dark current and a calibration method, which can make the dark current calibration done directly in pixels, and operation is more concise, through a structure of the present invention, dark pixels part can be better covered, and calibrated values of dark current and dark noise can be more accurate.

In order to achieve above purposes, the present invention adopts the following technical solution: an image sensor for real-time calibration of dark current, comprising a pixel array composed of at least one pixel unit, wherein: the pixel unit comprises a pixel photosensitive portion, a pixel dark shielding portion and a subtraction circuit, each of the pixel photosensitive portion and the pixel dark shielding portion includes a photodiode, a transfer transistor, a floating diffusion (FD) node, a reset transistor and a source follower transistor, the photodiodes in the photosensitive part and the pixel dark shielding portion are isolated by a deep trench isolation, the surface of the pixel dark shielding portion is covered with a dark shielding layer for shielding external incident light; both of the pixel photosensitive portion and the pixel dark shielding portion are controlled by a same voltage and sequential control, a light ambient voltage signal and a non-light ambient voltage signal are generated and connected to two ends of the subtraction circuit simultaneously, dark current calibration of the image sensor is realized by subtracting between the light ambient voltage signal and the non-light ambient voltage signal.

Further, the dark shielding layer includes a metal dark shielding layer.

Further, the dark shielding layer further includes a red filter, a green filter and a blue filter which are sequentially covered on the metal dark shielding layer.

Further, the stacked position order of the of the red filter, the green filter and the blue filter can be interchangeable.

Further, a flattened layer is on top of the photodiode, and the flattened layer includes a plurality of metal gratings, which are located above the deep trench isolation.

Further, the area of the photodiode in the pixel dark shielding portion is less than the area of the photodiode in the pixel photosensitive portion.

Further, the deep trench isolation is filled with a high dielectric material in form of a metal oxide.

Further, the pixel photosensitive portion comprises a photosensitive photodiode, a photosensitive transfer transistor, a photosensitive reset transistor and a photosensitive source follower transistor; the pixel dark shielding portion comprises a dark shielding photodiode, a dark shielding transfer transistor, a dark shielding reset transistor and a dark shielding source follower transistor; the subtraction circuit comprises a photosensitive switch transistor, a dark shielding switch transistor, a reset switch transistor, a capacitor and an output transistor; the specific circuit connection relationship is as follows: the photosensitive photodiode is connected with the source of the photosensitive transfer transistor, the gate of the photosensitive transfer transistor accesses a transmission TX signal, the drain of the photosensitive transfer transistor is simultaneously connected with the source of the photosensitive reset transistor and the gate of the photosensitive source follower transistor to form a floating diffusion (FD) node, the gate of the photosensitive reset transistor accesses a reset transistor RST signal, the drain of the photosensitive reset transistor is connected to a power VDD; the source of the photosensitive source follower transistor is connected to the power VDD, and the drain is simultaneously connected with a bias current and the source of the photosensitive switch transistor; the gate of the photosensitive switch transistor accesses a first switch signal, and the drain of the photosensitive switch transistor is connected with one end of the capacitor, and the other end of the capacitance is connected with the source of the reset switch transistor and the source of the output transistor, the drain of the output transistor is used to output a signal, the gate of the output transistor accesses a selected signal ROW; the drain of the reset switch transistor is grounded, and the gate accesses a reset switch signal SET; the dark shielding photodiode is connected with the source of the dark shielding transfer transistor, the gate of the dark shielding photodiode accesses a transmission TX signal; the drain of the dark shielding photodiode is simultaneously connected with the source of the dark shielding reset transistor and the gate of the dark shielding source follower transistor to form a floating diffusion node FD2, the gate of the dark shielding reset transistor accesses the reset transistor RST signal, the drain of the dark shielding reset transistor is connected to the power VDD; the source of the dark shielding source follower transistor is connected to the power VDD, the drain of the dark shielding source follower transistor is simultaneously connected with the bias current and the source of the dark shielding switch transistor; the gate of the dark shielding switch transistor accesses a second switch signal, and the drain is connected with one end of the capacitor together with the drain of the photosensitive switch transistor.

Further, the source and the drain in one transistor can be interchangeable.

The present invention provides a method for dark current calibration by an image sensor for real-time calibration of dark current, wherein the method comprises:

S01: at time t1, the selected signal ROW changes from low to high, and then maintains a high level, meanwhile, the reset switch signal SET changes from low to high at time t1, and the reset switch transistor is turned on, the reset switch signal SET becomes low at time t2;

S02: at time t3, the reset transistor RST signal changes from low to high, resets FD1 and FD2, and the reset transistor RST signal becomes low at time t4;

S03: at time t5, the first switch signal changes from low to high, the photosensitive switch transistor is turned on, the first switch signal becomes low at time t6;

S04: at time t7, the second switch signal changes from low to high, the dark shielding switch transistor is turned on, the second switch signal becomes low at time t8;

S05: at time t9, the reset switch signal SET changes from low to high, and the reset switch signal SET becomes low at time t10;

S06, at time t11, the transmission TX signal changes from low to high, and the transmission TX signal becomes low at time t12;

S07, at time t13, the first switch signal changes from low to high, the photosensitive switch transistor is turned on, the first switch signal becomes low at time t14;

S08: at time t15, the second switch signal changes from low to high, the dark shielding switch transistor is turned on, the second switch signal becomes low at time t16, the selected signal ROW changes to a low level at time t17, and a pixel signal processing is finished.

Beneficial effects of the present invention are as follows: the present invention provides a pixel structure and an image sensor which can directly perform dark current and dark noise calibration in real time in a pixel, and solves problems that numerical fluctuation of dark current over entire chip area and real-time calibration when using several rows or several columns of dark pixel arrays with fixed positions on chip edge for dark current calibration. Meanwhile, the structure proposed by the present invention adopts a metal shielding layer at a lower position from a photodiode to cooperate with a deep trench isolation filled with a dark shielding material and a color filter, so as to achieve better dark pixel shielding effect and achieve accurate dark current calibration.

Figure 1:
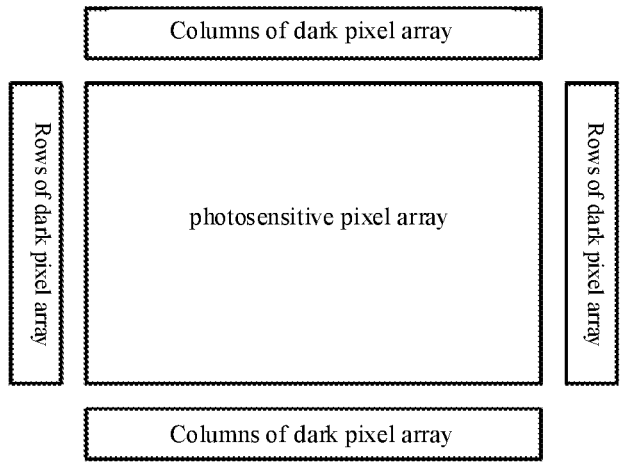
FIG. 1 shows an image sensor architecture for dark current calibration using a chip edge fixed position dark pixel array in the prior art.
Figure 2:
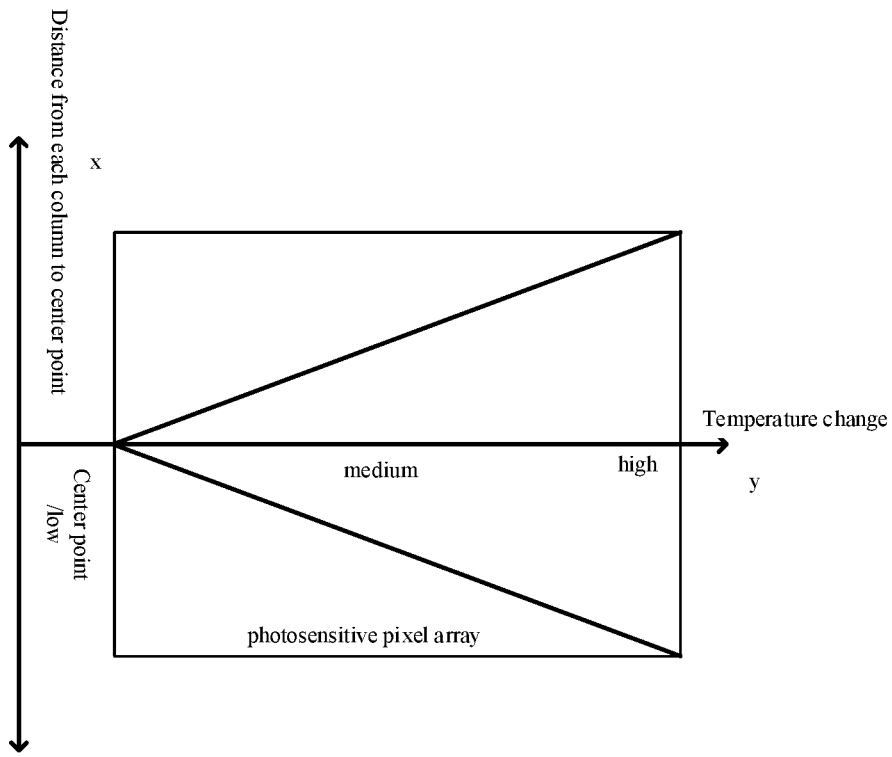
FIG. 2 shows temperature change trend of different positions on an image sensor chip in the prior art.
Figure 3:
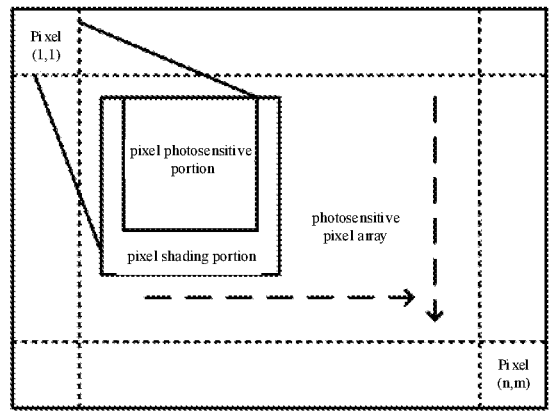
FIG. 3 shows a structural frame diagram of an image sensor for real-time calibration of dark current according to the present invention.

In the figure: 1: pixel photosensitive portion; 11: photosensitive photodiode; 12: photosensitive transfer transistor; 13: photosensitive reset transistor; 14: light source follower transistor; 2: pixel dark shielding portion; 21: dark shielding photodiode; 22: dark shielding transfer transistor; 23: dark shielding reset transistor; 24: dark shielding source follower transistor; 3: subtraction circuit; 31: photosensitive switching transistor; 32: dark shielding switching transistor; 33: reset switching transistor; 34: output transistor; 4: deep trench isolation; 5: dark shielding layer; 6: microlens; 7: filter; 71: red filter; 72: blue filter; 73: green filter; 8: flat layer; 9: silicon epitaxial layer; 10: silicon oxide substrate; 11: second metal layer.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the disclosure as recited in the appended claims. A deep learning process in the present disclosure can be employed to process multiple types of data, such as image data, or other types of two-dimensional multimedia data, such as two-dimensional voice data.

As shown in FIG. 3-6, an image sensor for real-time calibration of dark current is provided, which comprises a pixel array composed of at least one pixel unit, the pixel unit comprises a pixel photosensitive portion 1, a pixel dark shielding portion 2 and a subtraction circuit 3, each of the pixel photosensitive portion and the pixel dark shielding portion includes a photodiode, a transfer transistor, a floating diffusion (FD) node, a reset transistor and a source follower transistor, the pixel photosensitive portion comprises a photosensitive photodiode 11, a photosensitive transmission transistor 12, a photosensitive reset transistor 13 and a photosensitive source follower transistor 14; the pixel dark shielding portion 2 comprises a dark shielding photodiode 21, a dark shielding transfer transistor 22, a dark shielding reset transistor 23 and a dark shielding source follower transistor 24. The photodiode in the pixel photosensitive portion 1 and the pixel dark shielding portion 2 are isolated by a deep trench isolation 4, the surface of the pixel dark shielding portion 2 is covered with a dark shielding layer 5 to shield external incident light. Both of the pixel photosensitive portion 1 and the pixel dark shielding portion 2 are controlled by a same voltage and sequential control, a light ambient voltage signal and a non-light ambient voltage signal are generated and connected to two ends of the subtraction circuit simultaneously, dark current calibration of the image sensor is realized by subtracting the light ambient voltage signal and the non-light ambient voltage signal.

Figure 4:
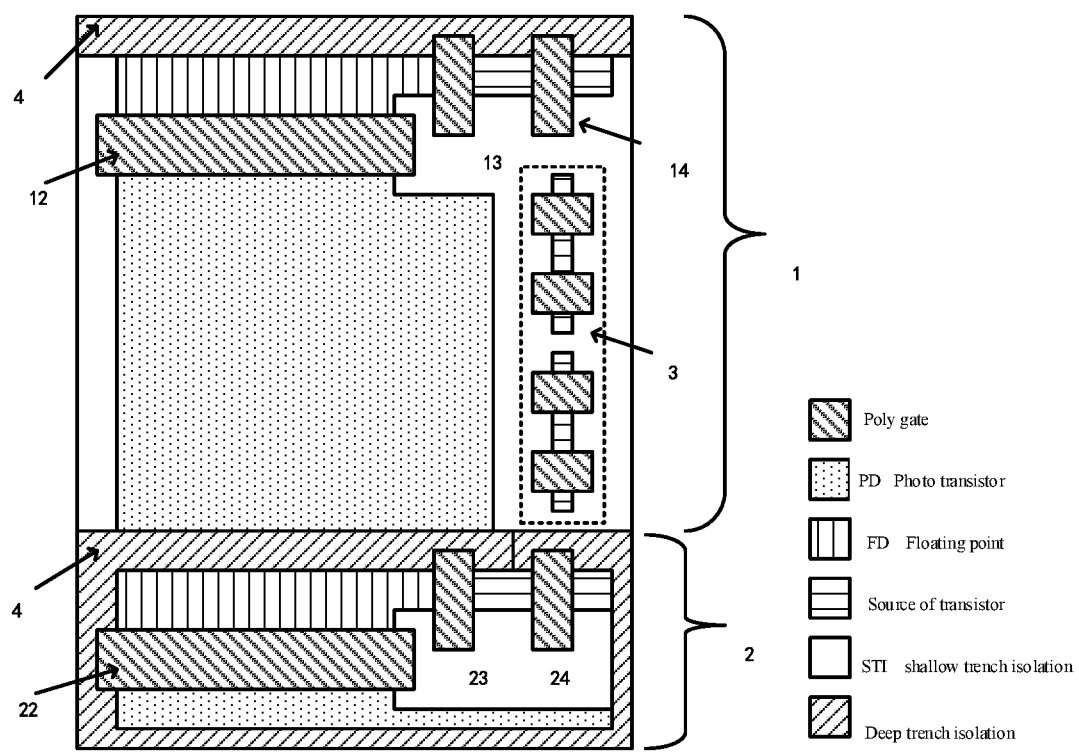
FIG. 4 shows a layout of an image sensor for real-time calibration of dark current according to the present invention (a layout schematic diagram without a dark shielding layer).
Figure 5:
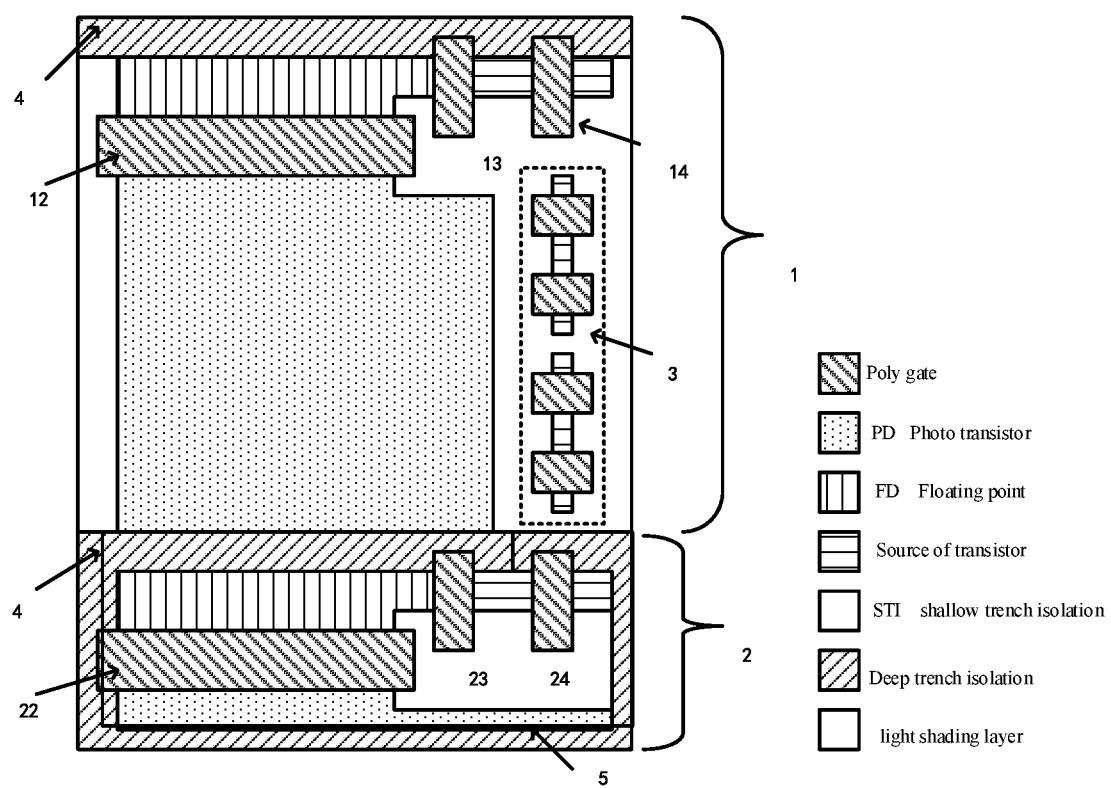
FIG. 5 shows a layout of an image sensor for real-time calibration of dark current according to the present invention (a layout schematic diagram with a dark shielding layer).

As shown in FIG. 4 and FIG. 5, FIG. 4 is a layout of a pixel structure of the present invention, a layout and an isolation method of the pixel photosensitive portion and the pixel dark shielding portion. FIG. 5 shows that on an actual chip layout, a pixel dark shielding portion of a pixel array is covered by a dark shielding layer 5, and no light is received in any case, which is used to generate a dark current or a dark noise for calibration. Meanwhile, as shown in FIG. 5, the pixel dark shielding portion of the pixel array is also isolated from the pixel photosensitive portion by adopting deep trench isolations 4, filling material of the deep trench isolation can be a high-K material in form of a metal oxide to make the deep trench isolation also had a dark shielding effect. Compared with the pixel photosensitive portion, the pixel dark shielding portion uses a smaller photodiode PD to improve a filling factor of the pixel photosensitive portion in the entire pixel array for normal imaging. Meanwhile, it is also because of a dark current that affects a fluctuation of the dark current or a dark noise, which is proved to be mainly from the channel interface of the transfer transistor, the overlap region of the transfer transistor and the photodiode, the overlap region of the transfer transistor tube and the floating diffusion node, the leakage of the floating diffusion node and the interface of the source follower, and thus the value of the upper and lower lengths of the photodiode used in the pixel dark shielding portion in FIG. 5 becomes less important.

Figure 6:
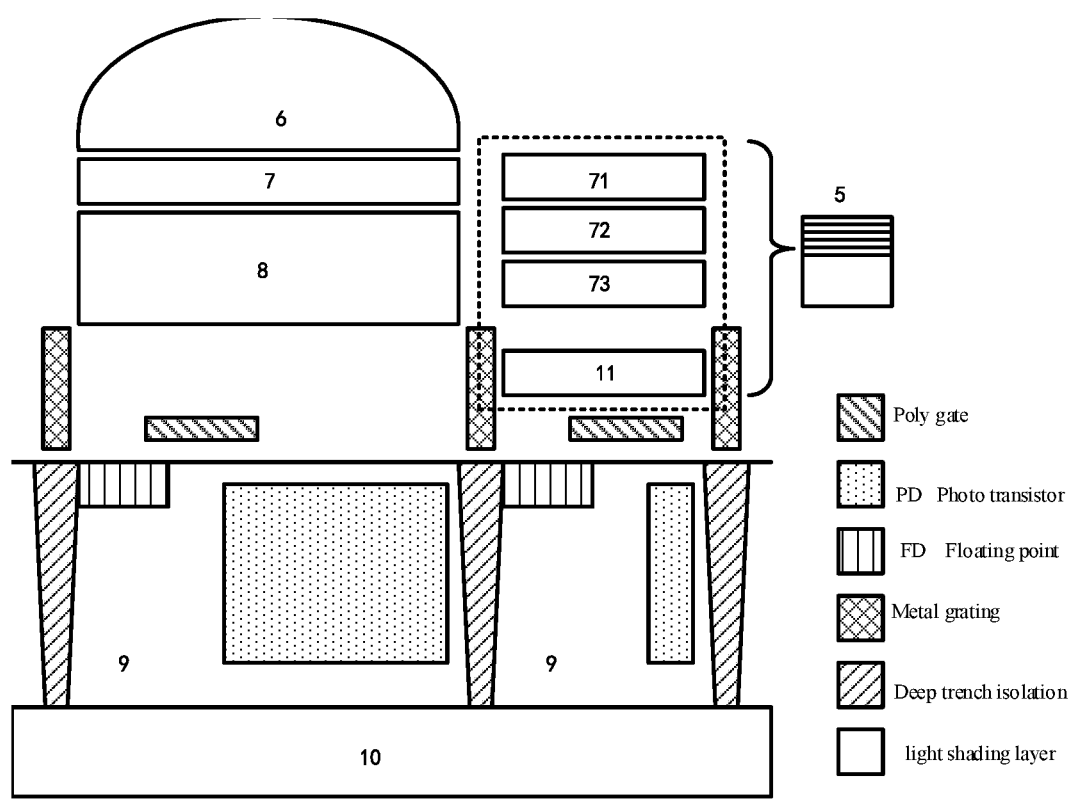
FIG. 6 is a cross-sectional view of an image sensor for real-time calibration of dark current according to the present invention.

As shown in FIG. 6, a cross-sectional view of an image sensor provided by the present invention is shown. The pixel photosensitive portion and the pixel dark shielding portion are completely isolated by a deep trench filled with a metal oxide, which not only blocked light leaked from the pixel photosensitive portion to the pixel dark shielding portion, but also isolated photo-generated electrons diffused from a silicon epitaxial layer, so as to make the dark current is not affected by a photosensitive pixel signal and improve accuracy of dark current calibration. Meanwhile, because of advantages of internal interconnection of a voltage and control signals of a pixel structure proposed in the present invention, a metal layer closer to silicon surface can be used to block lights, so as to have a better dark shielding effect. As shown in FIG. 6, the dark shielding layer 5 of the pixel dark shielding portion in the present invention blocks the lights by a metal layer, and a red filter 71, a green filter 72 and a blue filter 73 sequentially deposited above the metal layer, which sharply reduce light intensity firstly, and the stacked position order of the red filter, the green filter and the blue filter can be interchangeable. Due to lights are mainly composed of three wavelengths of a red light, a green light and a blue light, by superposition of three kinds of filters, the blue light, the green light and the red light of the lights can be filtered out in turn, so as to achieve purpose of attenuation of the light intensity. Meanwhile, in the pixel structure of the present invention, a plurality of metal gratings are formed in a flat layer 8 of a chip at a above position of each deep trench isolation, and height is between 2.0 um and 3.0 um, which are used to block slanting lights that may leak between surface of the dark shielding layer and the photodiode, so level of the dark pixel cannot be interfered by leaking lights, and prevent light disturbance on the photosensitive pixel. Therefore, as shown in FIG. 6, the pixel structure in the present invention adopting a lower metal layer to block through a second metal layer 11 in pixel cross-sectional direction, assisted with a red filter, a green filter and a blue filter, a deep trench isolation filled with a metal oxide material and a metal grating above the trench, so as to better block the pixel dark shielding portion, the dark current is not interfered by lights from the chip to achieve higher accuracy of dark current calibration.

Figure 7:
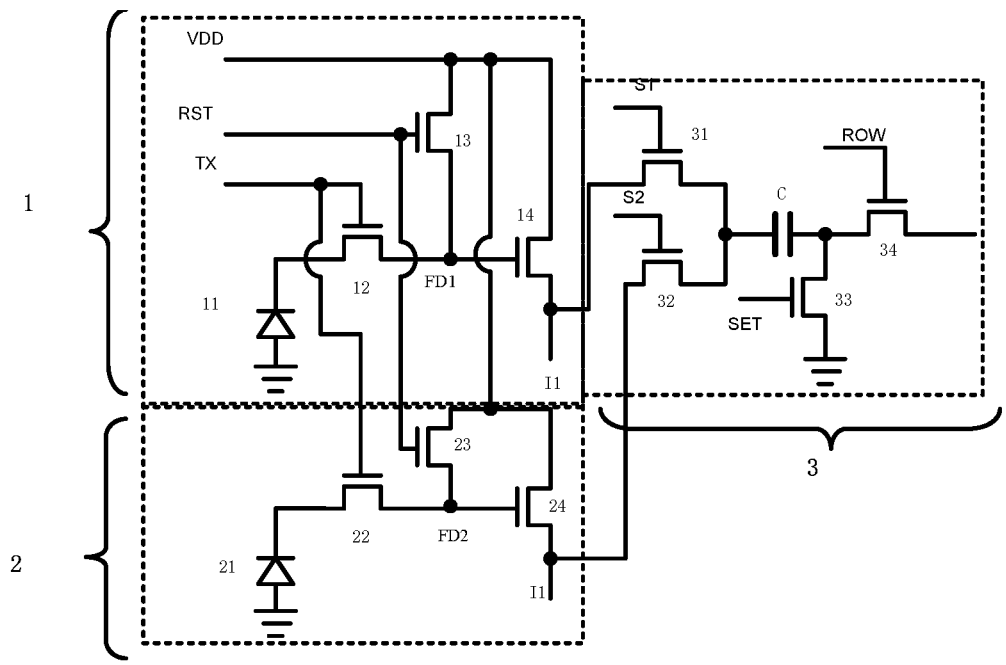
FIG. 7 is a circuit structure diagram of an image sensor for real-time calibration of dark current according to the present invention.

As shown in FIG. 7, a circuit structure diagram of an image sensor for real-time calibration of dark current according to the present invention, a pixel photosensitive portion 1 comprises a photosensitive photodiode 11, a photosensitive transfer transistor 12, a photosensitive reset transistor 13 and a photosensitive source follower transistor 14;

the pixel dark shielding portion 2 comprises a dark shielding photodiode 21, a dark shielding transfer transistor 22, a dark shielding reset transistor 23 and a dark shielding source follower transistor 24; a subtraction circuit 3 comprises a photosensitive switch transistor 31, a dark shielding switch transistor 32, a reset switch transistor 33, a capacitor C and an output transistor 34. The specific circuit connection relationship is as follows: the photosensitive photodiode 11 is connected with the source of the photosensitive transfer transistor 12, the gate of the photosensitive transfer transistor 12 accesses a transmission TX signal, the drain of the photosensitive transfer transistor 12 is simultaneously connected with the source of the photosensitive reset transistor 13 and the gate of the photosensitive source follower transistor 14 to form a floating diffusion node FD1, the gate of the photosensitive reset transistor 13 accesses a reset transistor RST signal, the drain of the photosensitive reset transistor 13 is connected to a power VDD; the source of the photosensitive source follower transistor 14 is connected to the power VDD, and the drain is simultaneously connected with a bias current 11 and the source of the photosensitive switch transistor 31; the gate of the photosensitive switch transistor 31 accesses a first switch signal, and the drain of the photosensitive switch transistor 31 is connected with one end of the capacitor, and the other end of the capacitance C is connected with the source of the reset switch transistor 33 and the source of the output transistor 34, the drain of the output transistor 34 is used to output a signal, the gate of the output transistor 34 accesses a selected signal ROW; the drain of the reset switch transistor 33 is grounded, and the gate accesses a reset switch signal SET; the dark shielding photodiode 21 is connected with the source of the dark shielding transfer transistor 22, the gate of the dark shielding photodiode 22 accesses a transmission TX signal; the drain of the dark shielding photodiode 22 is simultaneously connected with the source of the dark shielding reset transistor 23 and the gate of the dark shielding source follower transistor 24 to form a floating diffusion node FD2, the gate of the dark shielding reset transistor 23 accesses the reset transistor RST signal, the drain of the dark shielding reset transistor 23 is connected to the power VDD; the source of the dark shielding source follower transistor 24 is connected to the power VDD, the drain of the dark shielding source follower transistor 24 is simultaneously connected with the bias current 11 and the source of the dark shielding switch transistor 32; the gate of the dark shielding switch transistor 32 accesses a second switch signal, and the drain is connected with one end of the capacitor C together with the drain of the photosensitive switch transistor 31.

In the pixel unit pixel interconnection among the power VDD, photosensitive transfer transistors, photosensitive reset transistors and photosensitive source follower transistors, photosensitive switch transistors, the capacitor etc., can all be realized by a first layer of metal M1. Signal line for sequential control by a peripheral circuit, such as resetting and transmission, can be realized by a second layer of metal M2 and placed in a region of the pixel photosensitive portion. Therefore, adopting the pixel structure of the present invention, a dark shielding layer of a dark pixel part can be used with the second layer of metal M2, which is closer to surface of a photodiode in vertical direction, and thus has a better dark shielding effect than a general method of using topmost metal M4.

Figure 8:
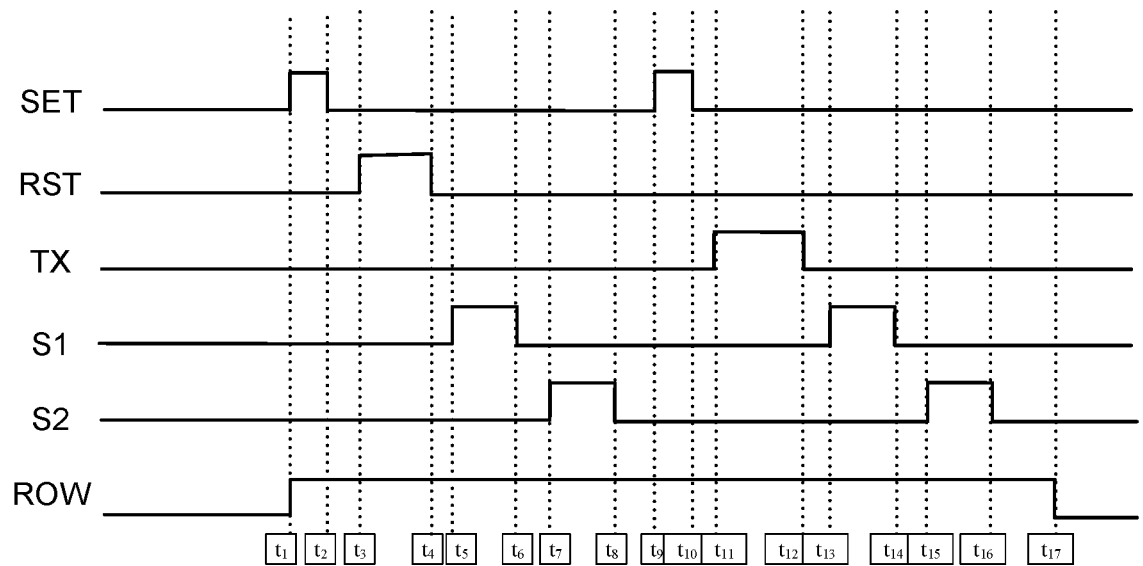
FIG. 8 is a timing diagram of an image sensor for real-time calibration of dark current according to the present invention.

As shown in FIG. 8, a timing diagram of an image sensor for real-time calibration of dark current according to the present invention, which used for signal reading and calibration, and includes the following steps:

S01: at time t1, the selected signal ROW changes from low to high, and then keeps a high level, meanwhile, the reset switch signal SET changes from low to high at time t1, and the reset switch transistor is turned on, the reset switch signal SET becomes low at time t2;

S02: at time t3, the reset transistor RST signal changes from low to high, resets FD1 and FD2, and the reset transistor RST signal becomes low at time t4;

S03: at time t5, the first switch signal changes from low to high, the photosensitive switch transistor is turned on, the first switch signal becomes low at time t6;

S04: at time t7, the second switch signal changes from low to high, the dark shielding switch transistor is turned on, the second switch signal becomes low at time t8;

S05: at time t9, the reset switch signal SET changes from low to high, and the reset switch signal SET becomes low at time t10;

S06, at time t11, the transmission TX signal changes from low to high, and the transmission TX signal becomes low at time t12;

S07, at time t13, the first switch signal changes from low to high, the photosensitive switch transistor is turned on, the first switch signal becomes low at time t14;

S08: at time t15, the second switch signal changes from low to high, the dark shielding switch transistor is turned on, the second switch signal becomes low at time t16, the selected signal ROW changes to a low level at time t17, and a pixel signal processing is finished.

Remarkably, time interval for each signal to maintain high level in above steps is set according to pixel size and sensor frame rate.

An advantage of the present invention is inaccuracy of calibration caused by uneven distribution of dark current and dark noise within a chip is greatly reduced by adopting direct dark current calibration in real time within a pixel. A pixel structure provided in the present invention discloses a pixel includes not only a photosensitive pixel portion used for normal imaging, but also a pixel dark shielding portion used for calibrating the pixel, and both of the two portions adopt a same voltage and sequential control. This not only ensures that the photosensitive pixel portion and the pixel dark shielding portion have an almost same dark current due to same working temperature and similar processing positions, but also ensures that readout noise of the two portions of the pixel is quite similar, because signals are read out at a same time avoids noise fluctuations in time domain; a light ambient voltage signal and a non-light ambient voltage signal generated corresponding to the pixel photosensitive portion and the pixel dark shielding portion are simultaneously connected to two ends of a subtraction circuit, a subtraction operation is performed between the light ambient voltage signal and the non-light ambient voltage signal by a subtraction circuit, an accurate voltage signal of the pixel photosensitive portion can be obtained by removing interference of dark current and noise effect. Moreover, in the pixel structure of the present invention, a simple and efficient calibration circuit for subtraction operation is designed within the pixel, so that calibration can be carried out directly within the pixel in real time, which avoids processes of reading entire array firstly, then storing and calibrating in a conventional method, and thus achieves higher timeliness and better calibration accuracy.

In addition, compared with a general dark pixel array distributed at edges, the pixel structure of the present invention provides dark pixels with better light blocking property, thereby also improves calibration accuracy of dark current and dark noise. The dark pixel array, which is generally distributed at edge of a pixel array, because connection and size of voltage and sequential control lines are exactly as same as those used for a photosensitive pixel, so a metal layer used for blocking lights is mostly a top metal far away from a photodiode, such as a fourth metal layer. Then a part of slanting lights leak in from side due to a higher space between the shielding layer and the photodiode, which affect use of the dark current. In a pixel structure of the present invention, the voltage and sequential control line is still arranged in the photosensitive pixel portion, and the pixel dark shielding portion only needs to be interconnected with the photosensitive pixel through a bottom metal, so that the dark shielding layer covered on the pixel dark shielding portion can use a second layer of metal M2 closer to the photodiode, which can greatly improve dark shielding effect and the calibration accuracy of the dark current. Moreover, the present invention also proposes that composition of the shielding layer not only includes a low-level metal M2, but also superimposes a red filter, a green filter and a blue filter on top to achieve a better dark shielding effect. Meanwhile, the pixel photosensitive portion and the pixel dark shielding portion in same pixel unit is isolated by a deep trench isolation filled with a metal oxide of a High-K material, and cooperated with metal gratings with height between 2.0 um and 3.0 um above the deep trench isolation, so as to avoid light leakage from the photosensitive portion such as the dark pixel portion. By combining above techniques, the present invention can improve the calibration accuracy of the dark current and the dark noise of the image sensor.

It will be appreciated that the disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. An image sensor for real-time calibration of dark current, comprising a pixel array composed of at least one pixel unit, wherein: the pixel unit comprises a pixel photosensitive portion, a pixel dark shielding portion and a subtraction circuit; the pixel photosensitive portion includes a photosensitive photodiode, a photosensitive transfer transistor, a first floating diffusion node FD1, a photosensitive reset transistor and a photosensitive source follower transistor; the pixel dark shielding portion comprises a dark shielding photodiode, a dark shielding transfer transistor, a second floating diffusion node FD2, a dark shielding reset transistor and a dark shielding source follower transistor; the photodiodes in the photosensitive part and the pixel dark shielding portion are isolated by a deep trench isolation, the surface of the pixel dark shielding portion is covered with a dark shielding layer for shielding external incident light; both of the pixel photosensitive portion and the pixel dark shielding portion are controlled by a same voltage and sequential control, a light ambient voltage signal and a non-light ambient voltage signal are generated and connected to two ends of the subtraction circuit simultaneously, dark current calibration of the image sensor is realized by subtracting between the light ambient voltage signal and the non-light ambient voltage signal; wherein, the subtraction circuit comprises a photosensitive switch transistor, a dark shielding switch transistor, a reset switch transistor, a capacitor and an output transistor; the gate of the photosensitive switch transistor accesses a first switch signal, and the drain of the photosensitive switch transistor is connected with one end of the capacitor, and the other end of the capacitor is connected with the source of the reset switch transistor and the source of the output transistor, the drain of the output transistor is used to output a signal, the gate of the output transistor accesses a selected signal ROW; the drain of the reset switch transistor is grounded, and the gate accesses a reset switch signal SET;

the gate of the dark shielding switch transistor accesses a second switch signal, and the drain is connected with one end of the capacitor together with the drain of the photosensitive switch transistor;

the gate of the photosensitive transfer transistor and the gate of the dark shielding photodiode access a transmission TX signal;

the gate of the photosensitive reset transistor and the gate of the dark shielding reset transistor access a reset transistor RST signal.

2. The image sensor of claim 1, wherein the dark shielding layer includes a metal dark shielding layer.

3. The image sensor of claim 2, wherein the dark shielding layer further includes a red filter, a green filter and a blue filter which are sequentially covered on the metal dark shielding layer.

4. The image sensor of claim 3, wherein the stacked position order of the red filter, the green filter and the blue filter can be interchangeable.

5. The image sensor of claim 1, wherein a flattened layer is on top of the photodiode, and the flattened layer includes a plurality of metal gratings, which are located above the deep trench isolation.

6. The image sensor of claim 1, wherein the area of the photodiode in the pixel dark shielding portion is less than the area of the photodiode in the pixel photosensitive portion.

7. The image sensor of claim 1, wherein the deep trench isolation is filled with a high dielectric material in form of a metal oxide.

8. The image sensor of claim 1, wherein the specific circuit connection relationship is as follows: the photosensitive photodiode is connected with the source of the photosensitive transfer transistor, the drain of the photosensitive transfer transistor is simultaneously connected with the source of the photosensitive reset transistor and the gate of the photosensitive source follower transistor to form the first floating diffusion node FD1, the drain of the photosensitive reset transistor is connected to a power VDD; the source of the photosensitive source follower transistor is connected to the power VDD, and the drain is simultaneously connected with a bias current and the source of the photosensitive switch transistor; the dark shielding photodiode is connected with the source of the dark shielding transfer transistor; the drain of the dark shielding photodiode is simultaneously connected with the source of the dark shielding reset transistor and the gate of the dark shielding source follower transistor to form the second floating diffusion node FD2, the drain of the dark shielding reset transistor is connected to the power VDD; the source of the dark shielding source follower transistor is connected to the power VDD, the drain of the dark shielding source follower transistor is simultaneously connected with the bias current and the source of the dark shielding switch transistor.

9. The image sensor of claim 8, wherein the source and the drain in one transistor can be interchangeable.

10. A method for dark current calibration by the image sensor of claim 1, wherein the method comprises:

S01: at time t1, the selected signal ROW changes from low to high, and then maintains a high level, meanwhile, the reset switch signal SET changes from low to high at time t1, and the reset switch transistor is turned on, the reset switch signal SET becomes low at time t2;

S02: at time t3, the reset transistor RST signal changes from low to high, resets FD1 and FD2, and the reset transistor RST signal becomes low at time t4;

S03: at time t5, the first switch signal changes from low to high, the photosensitive switch transistor is turned on, the first switch signal becomes low at time t6;

S04: at time t7, the second switch signal changes from low to high, the dark shielding switch transistor is turned on, the second switch signal becomes low at time t8;

S05: at time t9, the reset switch signal SET changes from low to high, and the reset switch signal SET becomes low at time t10;

S06, at time t11, the transmission TX signal changes from low to high, and the transmission TX signal becomes low at time t12;

S07, at time t13, the first switch signal changes from low to high, the photosensitive switch transistor is turned on, the first switch signal becomes low at time t14;

S08: at time t15, the second switch signal changes from low to high, the dark shielding switch transistor is turned on, the second switch signal becomes low at time t16, the selected signal ROW changes to a low level at time t17, and a pixel signal processing is finished.

* * * * *